(12) United States Patent
Sun et al.

(10) Patent No.: US 12,457,869 B2
(45) Date of Patent: Oct. 28, 2025

(54) DISPLAY SUBSTRATE, METHOD FOR REPAIRING SAME, METHOD FOR PREPARING SAME, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Shi Sun, Beijing (CN); Xuewu Xie, Beijing (CN); Hao Liu, Beijing (CN); Yu Ai, Beijing (CN); Bowen Liu, Beijing (CN); Yubao Kong, Beijing (CN); Weidong Yin, Beijing (CN)

(73) Assignees: Hefei Xinsheng Optoelectronics Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/027,212

(22) PCT Filed: Jun. 22, 2022

(86) PCT No.: PCT/CN2022/100388
§ 371 (c)(1),
(2) Date: Mar. 20, 2023

(87) PCT Pub. No.: WO2023/245487
PCT Pub. Date: Dec. 28, 2023

(65) Prior Publication Data
US 2024/0315093 A1    Sep. 19, 2024

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/1213* (2023.02); *H10K 59/1216* (2023.02); *H10K 71/861* (2023.02)

(58) Field of Classification Search
CPC .............. H10K 59/131; H10K 71/861; H10K 59/1201; H10K 59/1213; H10K 59/1216
(Continued)

(56) References Cited

U.S. PATENT DOCUMENTS 9,129,923 B1    9/2015  Han et al.
9,147,723 B1    9/2015  Lee et al.
(Continued)

FOREIGN PATENT DOCUMENTS

CN    105225639 A    1/2016
CN    105374843 A    3/2016
(Continued)

*Primary Examiner* — Igwe U Anya
(74) *Attorney, Agent, or Firm* — IPro, PLLC

(57) ABSTRACT

Provided is a display substrate, including: a substrate; a plurality of pixels disposed on a side of the substrate, each of the pixels including a pixel circuit and a light-emitting element; and at least one second power line and a plurality of repair lines that are disposed on a side of the substrate. The pixel circuit is configured to transmit a drive signal to the first electrode of the light-emitting element, and the light-emitting element is configured to emit light based on the drive signal and a first power signal supplied by the first power line. The second power line is coupled to the repair line. The second power line is configured to transmit a second power signal to the first electrode of the coupled light-emitting element by the repair line. A potential of the second power signal is greater than a potential of the first power signal.

20 Claims, 10 Drawing Sheets

(51) Int. Cl.
*H10K 59/121* (2023.01)
*H10K 71/00* (2023.01)

(58) Field of Classification Search
USPC .......................................................... 257/40
See application file for complete search history.

(56) References Cited

U.S. PATENT DOCUMENTS

| | | | | |
|---|---|---|---|---|
| 2014/0346475 | A1* | 11/2014 | Cho | H10D 86/423 |
| | | | | 438/4 |
| 2015/0161931 | A1* | 6/2015 | Lee | G09G 3/3266 |
| | | | | 345/77 |
| 2015/0248861 | A1* | 9/2015 | Kong | G09G 3/006 |
| | | | | 345/212 |
| 2015/0294618 | A1* | 10/2015 | Park | G09G 3/3291 |
| | | | | 345/78 |
| 2015/0364531 | A1* | 12/2015 | Kim | H10K 71/00 |
| | | | | 438/4 |
| 2016/0233286 | A1 | 8/2016 | Kim et al. | |
| 2017/0053591 | A1* | 2/2017 | Seo | G09G 3/3225 |
| 2017/0316737 | A1* | 11/2017 | Park | G09G 3/3208 |
| 2019/0027549 | A1 | 1/2019 | Ai et al. | |

FOREIGN PATENT DOCUMENTS

| | | |
|---|---|---|
| CN | 105097867 B | 4/2017 |
| CN | 108258007 A | 7/2018 |
| CN | 114442390 A | 5/2022 |
| CN | 114447082 A | 5/2022 |
| CN | 114460770 A | 5/2022 |
| JP | 2008123700 A | 5/2008 |
| KR | 20150072225 A | 6/2015 |

\* cited by examiner

DISPLAY SUBSTRATE, METHOD FOR REPAIRING SAME, METHOD FOR PREPARING SAME, AND DISPLAY DEVICE

CROSS-REFERENCE TO RELATED APPLICATION

The present disclosure is a U.S. national stage of international application No. PCT/CN2022/100388, filed on Jun. 22, 2022, the content of which is herein incorporated by reference in its entirety.

TECHNICAL FIELD

The present disclosure relates to the field of display technologies, and in particular, relates to a display substrate, a method for repairing the same, a method for preparing the same, and a display device.

BACKGROUND OF THE INVENTION

Organic light-emitting diode (OLED) display substrates are widely used in various display devices because of their advantages such as self-illumination, wide viewing angle, fast response, low power consumption, and high contrast ratio.

SUMMARY OF THE INVENTION

Embodiments of the present disclosure provide a display substrate, a method for repairing the same, a method for preparing the same, and a display device. The technical solutions are as follows.

According to one aspect of some embodiments of the present disclosure, a display substrate is provided. The display substrate includes:
- a substrate;
- a plurality of pixels, disposed on a side of the substrate, each of the pixels including a pixel circuit and a light-emitting element, wherein the pixel circuit is coupled to a first electrode of the light-emitting element, a second electrode of the light-emitting element is coupled to a first power line, the pixel circuit is configured to transmit a drive signal to the first electrode of the light-emitting element, and the light-emitting element is configured to emit light based on the drive signal and a first power signal supplied by the first power line; and
- at least one second power line and a plurality of repair lines that are disposed on a side of the substrate, wherein the second power line is coupled to the repair line, an orthographic projection of the repair line on the substrate being overlapped with an orthographic projection of the first electrode of the light-emitting element on the substrate, the repair line is configured to couple the second power line to a first electrode of a light-emitting element in a defective pixel in the plurality of pixels, and the second power line is configured to transmit a second power signal to the first electrode of the coupled light-emitting element by the repair line;
- wherein the defective pixel includes a dark pixel, and a potential of the second power signal is greater than a potential of the first power signal.

In some embodiments, the potential of the first power signal is zero, and the potential of the second power signal is greater than 6 V and less than or equal to 12 V.

In some embodiments, the plurality of pixels are of at least two colors, and at least two pixels of a same color share a same one of the repair lines;
- the repair line is further configured to couple the first electrode of the light-emitting element in the defective pixel to a first electrode of a light-emitting element in a normal pixel, the normal pixel and the defective pixel sharing a same one of the repair lines and being of a same color, and the defective pixel including a bright pixel; and
- in response to the repair line coupling the first electrode of the light-emitting element in the defective pixel to the first electrode of the light-emitting element in the normal pixel, the first electrode of the light-emitting element in the defective pixel is decoupled from a pixel circuit in the defective pixel, and the first electrode of the light-emitting element in the defective pixel is decoupled from the second power line.

In some embodiments, the plurality of pixels are arranged in arrays, and the normal pixel and the defective pixel are two adjacent pixels disposed in a same column.

In some embodiments, the first electrode of the light-emitting element is an anode, and the second electrode of the light-emitting element is a cathode.

In some embodiments, the first electrode of the light-emitting element includes a first portion and a second portion that are spaced apart.

In some embodiments, the pixel circuit includes a data-write sub-circuit, a sense sub-circuit, a regulate sub-circuit, and a drive sub-circuit; wherein
- the data-write sub-circuit is coupled to a first gate line, a data line, and a control terminal of the drive sub-circuit, and the data-write sub-circuit is configured to control, in response to a first gate drive signal supplied by the first gate line, conduction or cutoff between the control terminal of the drive sub-circuit and the data line;
- the sense sub-circuit is coupled to a second gate line, a sense line, and an output terminal of the drive sub-circuit, and the sense sub-circuit is configured to control, in response to a second gate drive signal supplied by the second gate line, conduction or cutoff between the output terminal of the drive sub-circuit and the sense line;
- the regulate sub-circuit is coupled to the control terminal and the output terminal of the drive sub-circuit, and the regulate sub-circuit is configured to regulate potentials of the control terminal and the output terminal of the drive sub-circuit; and
- an input terminal of the drive sub-circuit is coupled to a drive power line, the output terminal of the drive sub-circuit is further coupled to the first electrode of the light-emitting element, and the drive sub-circuit is configured to transmit, in response to a drive power signal supplied by the drive power line and a signal of the control terminal, a drive signal to the first electrode of the light-emitting element;
- wherein the second power line is the sense line.

In some embodiments, the data-write sub-circuit includes a first transistor; the sense sub-circuit includes a second transistor; the regulate sub-circuit includes a storage capacitor; and the drive sub-circuit includes a third transistor; wherein
- a gate electrode of the first transistor is coupled to the first gate line, a first electrode of the first transistor is coupled to the data line, and a second electrode of the first transistor is coupled to a gate electrode of the third transistor;

a gate electrode of the second transistor is coupled to the second gate line, a first electrode of the second transistor is coupled to the sense line, and a second electrode of the second transistor is coupled to a second electrode of the third transistor;

one terminal of the storage capacitor is coupled to a gate electrode of the third transistor, and the other terminal of the storage capacitor is coupled to the second electrode of the third transistor; and a first electrode of the third transistor is coupled to the drive power line, and the second electrode of the third transistor is further coupled to the first electrode of the light-emitting element.

In some embodiments, the second power line and the repair line are disposed in different layers, and the display substrate further includes:

an insulator layer disposed between the second power line and the repair line, and a via running through the insulator layer, wherein the second power line is lapped to the repair line by the via.

In some embodiments, the pixel circuit further includes an active layer, a gate insulator layer, a gate metal layer, an inter-layer dielectric layer, and a source-drain metal layer that are successively stacked along a direction away from the substrate; and the display substrate further includes a light shield layer disposed between the substrate and the active layer;

wherein the second power line and the source-drain metal layer are disposed in a same layer, and the repair line and the light shield layer are disposed in a same layer.

According to another aspect of some embodiments of the present disclosure, a method for repairing a display substrate as described above is provided. The method includes:

in the case that a defective pixel is present in a plurality of pixels, and the defective pixel is a dark pixel, coupling a second power line to a first electrode of a light-emitting element in the defective pixel by a repair line; and supplying a second power signal to the first electrode of the light-emitting element in the defective pixel by the second power line;

wherein a potential of the second power signal is greater than a potential of a first power signal supplied by a first power line coupled to a second electrode of the light-emitting element.

In some embodiments, the method further includes:

in the case that fused foreign matter is exhibited in the defective pixel, decoupling the second power line from the first electrode of the light-emitting element in the defective pixel; and in the case that the fused foreign matter is not exhibited in the defective pixel or the defective pixel is a bright pixel, decoupling the first electrode of the light-emitting element in the defective pixel from a pixel circuit in the defective pixel, decoupling the first electrode of the light-emitting element in the defective pixel from the second power line, and coupling the first electrode of the light-emitting element in the defective pixel to a first electrode of a light-emitting element in a normal pixel by the repair line, wherein the normal pixel and the defective pixel share a same one of the repair lines and are of a same color.

In some embodiments, coupling the second power line to the first electrode of the light-emitting element in the defective pixel by the repair line includes:

welding, by a laser welding process, the repair line to the first electrode of the light-emitting element in the defective pixel to couple the second power line to the first electrode of the light-emitting element in the defective pixel by the repair line;

coupling the first electrode of the light-emitting element in the defective pixel to the first electrode of the light-emitting element in the normal pixel by the repair line includes:

welding, by the laser welding process, the repair line to the first electrode of the light-emitting element in the defective pixel and the first electrode of the light-emitting element in the normal pixel to couple the first electrode of the light-emitting element in the defective pixel to the first electrode of the light-emitting element in the normal pixel;

decoupling the first electrode of the light-emitting element in the defective pixel from the second power line includes:

coupling, by a laser cutting process, the repair line to the first electrode of the light-emitting element in the defective pixel to decouple the second power line from the first electrode of the light-emitting element in the defective pixel; and decoupling the first electrode of the light-emitting element in the defective pixel from the pixel circuit in the defective pixel includes:

decoupling, by the laser cutting process, the first electrode of the light-emitting element in the defective pixel from the pixel circuit in the defective pixel.

According to still another aspect of some embodiments of the present disclosure, a method for preparing a display substrate as described above is provided. The method includes:

providing a substrate;

forming a plurality of pixels on a side of the substrate, wherein each of the pixels includes a pixel circuit and a light-emitting element, wherein the pixel circuit is coupled to a first electrode of the light-emitting element, a second electrode of the light-emitting element is coupled to a first power line, the pixel circuit is configured to transmit a drive signal to the first electrode of the light-emitting element, and the light-emitting element is configured to emit light based on the drive signal and a first power signal supplied by the first power line; and forming at least one second power line and a plurality of repair lines on a side of the substrate and coupling the second power line to the repair line, wherein an orthographic projection of the repair line on the substrate is overlapped with an orthographic projection of the first electrode of the light-emitting element on the substrate, the repair line is configured to couple the second power line to a first electrode of a light-emitting element in a defective pixel in the plurality of pixels, and the second power line is configured to transmit a second power signal to the first electrode of the coupled light-emitting element by the repair line;

wherein the defective pixel includes a dark pixel, and a potential of the second power signal is greater than a potential of the first power signal.

According to yet still another aspect of some embodiments of the present disclosure, a display device is provided. The display device includes a power supply component and the display substrate as described above;

wherein the power supply component is coupled to the display substrate and is configured to supply power to the display substrate.

BRIEF DESCRIPTION OF DRAWINGS

For clearer descriptions of the technical solutions in the embodiments of the present disclosure, the following briefly introduces the accompanying drawings to be required in the descriptions of the embodiments. Apparently, the accompanying drawings in the following description show merely some embodiments of the present disclosure, and persons of ordinary skills in the art may still derive other drawings from these accompanying drawings without creative efforts.

DETAILED DESCRIPTION

Figure 1:
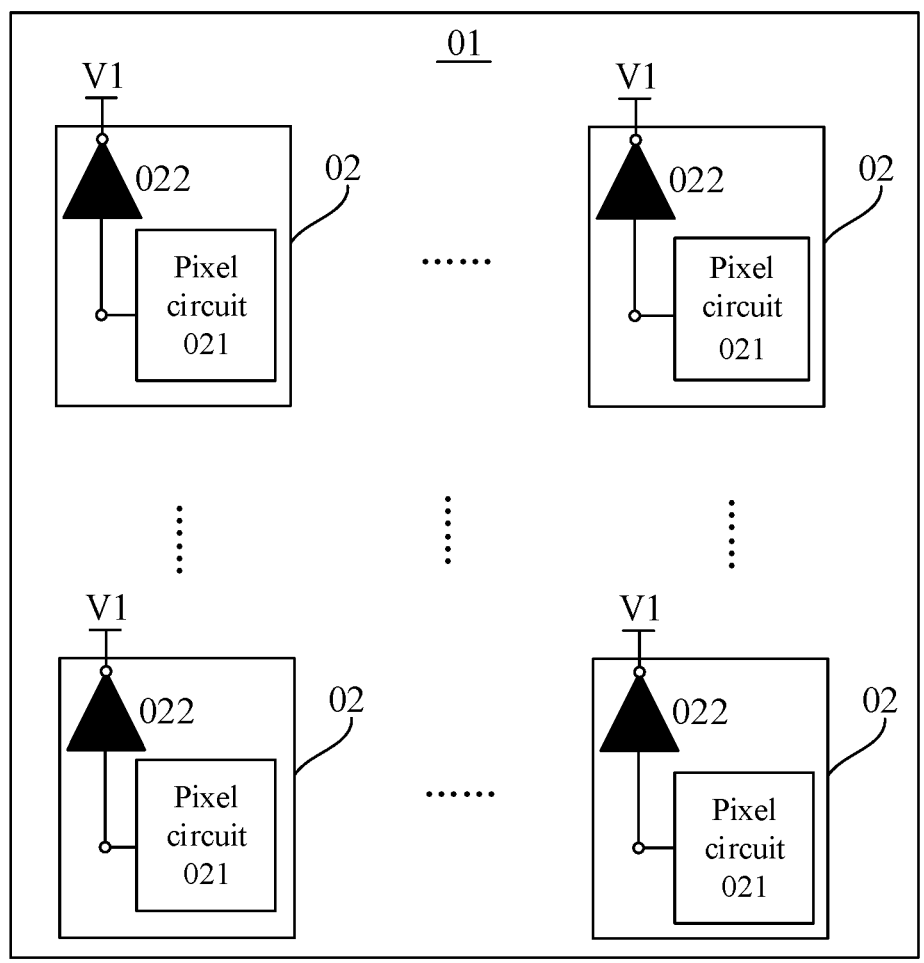
FIG. 1 is a schematic structural diagram of a display substrate according to some embodiments of the present disclosure.

The present disclosure is described in further detail with reference to the accompanying drawings, to clearly present the objects, technical solutions, and advantages of the present disclosure.

Typically, an OLED display substrate generally includes a substrate and a plurality of pixels disposed on a side of the substrate. Each of the pixels includes a pixel circuit and a light-emitting element. The light-emitting element includes an anode and a cathode that are successively stacked. The pixel circuit is coupled to the anode of the light-emitting element and is configured to transmit a light-emitting drive signal to the anode of the light-emitting element. The cathode of the light-emitting element is coupled to a power line and is configured to emit light as a result of a voltage difference between the light-emitting drive signal received by the anode and a power signal supplied by the power line to the cathode.

However, it is found that in a process of preparing the OLED display substrate, in the case that foreign matter falls between the anode and cathode of the light-emitting element, the anode and cathode of the light-emitting element are prone to a short circuit. In this way, the light-emitting element is not capable of normally emitting light, such that the dark pixel defect occurs on the OLED display substrate, and thus the display effect is poor.

It is found that, in addition to the dark pixel defect documented in some practices, a bright pixel defect also occurs in pixels. The dark pixel defect means that a pixel fails to be normally lit and thus fails to emit light, and a pixel with the dark pixel defect is also referred to as a dark pixel. The bright pixel defect means that a pixel is normally lit but has an abnormal luminance (typically a great luminance), and a pixel with the bright pixel defect is also referred to as a bright pixel. Both the dark and bright pixels are defective pixels, and a pixel that is normally lit and has a normal luminance is a normal pixel. Causes to the dark pixel defect include a short circuit between an anode and a cathode of a light-emitting element due to foreign matter and abnormality of devices (e.g., a transistor or a capacitor) in a pixel circuit. Causes to the bright pixel defect typically include abnormality of devices in the pixel circuit, such as a transistor threshold voltage drift.

At present, when a pixel has the dark pixel defect, whether the dark pixel defect is caused by foreign matter or abnormality of devices in the pixel circuit is generally determined by observation. In the case that it is determined that the dark pixel defect is caused by the foreign matter, a part, where the foreign matter is located, of an anode is cut off. This processing approach is often employed in a display product where the anode is divided into two. In the event of the foreign matter, a half of the pixel that is divided into two is cut off, and the pixel is capable of normally emitting light under a voltage difference between the other half of the pixel and the cathode, that is, causing only a half of the pixel to emit light. The display product that is divided into two is generally a transparent display product that has both display and light-transmission functions. The light transmission function is achieved by sacrificing the resolution. Therefore, the resolution of the transparent display product is generally low, a pixel pitch is large, and the dark pixel defect is obvious in the transparent display product. Consequently, the dark pixel defect is improved by designing the anode to be divided into two. In the case that it is determined that the dark pixel defect is caused by the abnormality of devices in the pixel circuit, it fails to be repaired. In the case that the bright pixel defect occurs in a pixel, typically an entirety of an anode of the pixel is cut directly, such that the entire pixel does not emit light. That is, the bright pixel is repaired to a dark pixel. A pixel according to the embodiments of the present disclosure refers to a sub-pixel.

The above processing approaches have the following problems. First, for the transparent display products, in the case that the pixel is repaired to a half for emitting light, a display effect of the macroscopic observation is still poor because of the low resolution of the product itself and the large transparent region. Second, the foreign matter is generally too small to be observed even using a microscope, such that it is impossible to distinguish the cause to the dark pixel defect, and thus the defect is not capable of being repaired. Moreover, even if it is determined that the dark pixel defect is caused by the foreign matter, the location of the foreign matter fails to be reliably determined, such that it is impossible to determine which part of the anode shall be cut, and thus the repair of the defective pixel is still impossible. Tests indicate that about 40% of the dark pixel defects fails to be found. Third, it is difficult finding the dark pixel defect caused by the abnormality of devices in the pixel circuit, especially the dark pixel in a top-emitting display product with a reflective cathode and a light shield layer. Tests indicate that currently about 90% of the dark pixels are not capable of being observed under the microscope. Fourth, a light-emitting area of a half of the pixel is small relative to a light-emitting area of the entire pixel, but a potential of a drive signal supplied to a part of the anode and a potential of a drive signal supplied to the entire anode are the same. In this way, a current density is high. In the case that a half of the pixel is lit for a long time, a difference in luminance between the half of the pixel and the surrounding normal entire pixel becomes greater, such that the half of the pixel is prone to reliability failure and become the dark pixel again. Fifth, pixels with the dark pixel defect or the bright pixel defect that are caused by the abnormality of devices in the pixel circuit actually are not capable of being repaired to normal pixels.

Accordingly, the embodiments of the present disclosure provide a new display substrate and a method for repairing defects, which reliably improve the dark pixel defect and the bright pixel defect based on solving the above problems.

FIG. 1 is a schematic structural diagram of a display substrate according to some embodiments of the present disclosure. As illustrated in FIG. 1, the display substrate includes:

a substrate 01; and a plurality of pixels 02 disposed on a side of the substrate 01.

Each of the pixels 02 includes a pixel circuit 021 and a light-emitting element 022. The pixel circuit 021 is coupled (i.e., electrically connected) to a first electrode of the light-emitting element 022, and a second electrode of the light-emitting element 022 is coupled to a first power line V1. The pixel circuit 021 is configured to transmit a drive signal (e.g., a drive current) to the first electrode of the light-emitting element 022, and the light-emitting element 022 is configured to emit light based on the drive signal received by the first electrode and a first power signal supplied by the first power line V1. For example, the light-emitting element 022 emits light under a voltage difference between the drive signal and the first power signal.

Optionally, in the first electrode and the second electrode of the light-emitting element 022, one is an anode and the other is a cathode. Exemplarily, as illustrated in FIG. 1, the first electrode is the anode and the second electrode is the cathode.

Figure 2:
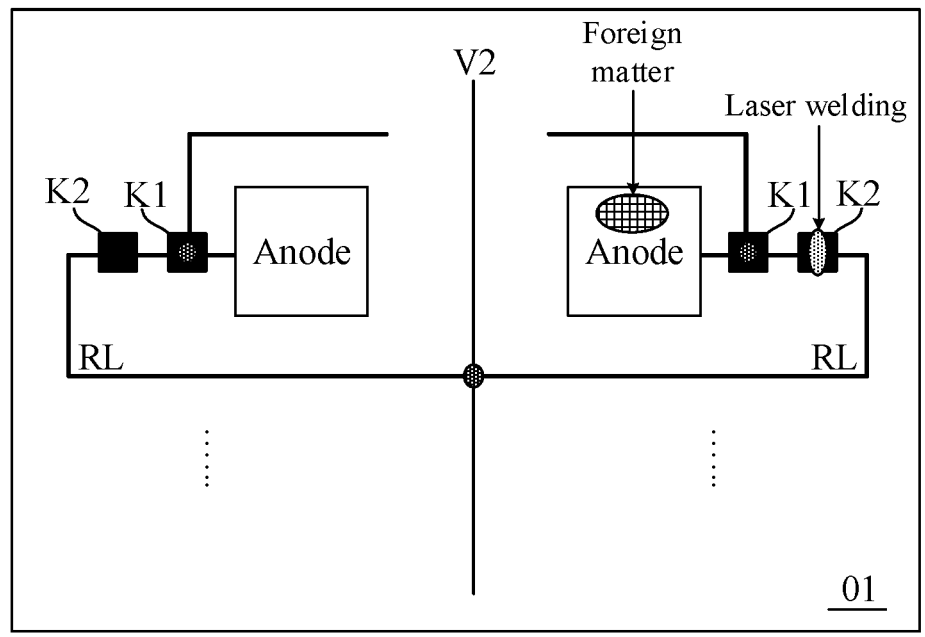
FIG. 2 is a schematic equivalent diagram of a partial structure of a display substrate according to some embodiments of the present disclosure.

Based on FIG. 1, and referring to a schematic equivalent diagram of a partial structure of a display substrate illustrated in FIG. 2, the display substrate according to some embodiments of the present disclosure further includes at least one second power line V2 and a plurality of repair lines RL that are disposed on a side of the substrate 01. The second power line V2 is coupled to the repair line RL. An orthographic projection of the repair line RL on the substrate 01 is overlapped with an orthographic projection of the first electrode of the light-emitting element 022 on the substrate 01.

It should be noted that FIG. 2 only illustrates the first electrode of the light-emitting element 022 and one of the second power lines V2, and the pixel circuit 02 is not illustrated.

Based on the arrangement described above, the repair line RL of the embodiments of the present disclosure is configured to couple the second power line V2 to a first electrode of a light-emitting element 022 in a defective pixel 02 in the plurality of pixels 02. The second power line V2 is configured to transmit a second power signal to the first electrode of the coupled light-emitting element 022 by the repair line RL.

The defective pixel includes a dark pixel. A potential of the second power signal is greater than a potential of the first power signal. For example, the potential of the first power signal is less than or equal to zero, and the potential of the second power signal is greater than zero. Accordingly, in the case that the dark pixel appears as a result of foreign matter, upon coupling the second power line V2 to the first electrode of the light-emitting element 022, the foreign matter stuck between the first and second electrodes of the light-emitting element is burnt out by flexibly arranging the potential of the second power signal supplied by the second power line V2. That is, the foreign matter is fused. In the case that the foreign matter is fused, the first electrode of the light-emitting element is not short-circuited to the second electrode, such that the light-emitting element is capable of being lit normally, and thus the dark pixel disappears, and the problem of the dark pixel defect is addressed.

Exemplarily, referring to FIG. 2, in some embodiments of the present disclosure, in the case that the dark pixel does not appear, the repair line RL is only overlapped with the first electrode of the light-emitting element 022 and is not coupled to it. In the case that the dark pixel appears, some connection processes are further performed to couple the repair line RL to the first electrode of the light-emitting element 022 to indirectly couple the second power line V2 to the first electrode of the light-emitting element 022, such that the problem of the dark pixel defect is addressed. For example, the connection process includes a laser welding process. Accordingly, coupling the repair line RL to the first electrode of the light-emitting element 022 is also referred to as welding the repair line RL to the first electrode of the light-emitting element 022, such that a reliable coupling is achieved.

Optionally, referring to FIG. 2, the pixel circuit 021 is coupled to the first electrode of the light-emitting element 022 by a first via K1. The repair line RL is coupled to the first electrode of the light-emitting element 022 by a second via K2. Accordingly, the orthographic projection of the repair line RL on the substrate 01 being overlapped with the orthographic projection of the first electrode of the light-emitting element 022 on the substrate 01 refers to the orthographic projection of the repair line RL on the substrate 01 being overlapped with an orthographic projection of the second via K2 on the substrate 01. Welding the repair line RL to the first electrode of the light-emitting element 022 refers to performing a welding process on the second via K2. In the case that the first electrode is the anode, both the first via K1 and the second via K2 are referred to as anode vias. The first via K1 and the second via K2 are spaced apart or arranged to be a same via.

In this way, in some embodiments of the present disclosure, the problem of the dark pixel defect is addressed by deploying the repair line RL to extend the second power line V2 next to the anode of the light-emitting element 022, and by expanding an area of the anode via to the repair line RL. Therefore, the repair line RL is referred to as a branch of the second power line V2.

In summary, some embodiments of the present disclosure provide a display substrate. The display substrate includes the plurality of pixels, the second power line, and the repair line that are disposed on a side of the substrate. The second power line is coupled to the repair line, and the repair line is configured to couple the second power line to the first electrode of the light-emitting element in the defective pixel, such that the second power line transmits the second power signal to the first electrode of the light-emitting element. The potential of the second power signal is greater than the potential of the first power signal supplied by the first power line coupled to the second electrode of the light-emitting element. In this way, by flexibly arranging the potential of the second power signal, the foreign matter is reliably burnt out in the case that the dark pixel appears because of the short-circuit between the first electrode and the second electrode of the light-emitting element as a result of the foreign matter. Therefore, the first electrode of the light-emitting element is no longer short-circuited to the second electrode, such that the problem of the dark pixel defect is addressed, and thus a better display effect of the display substrate is achieved.

Optionally, in some embodiments of the present disclosure, the potential of the first power signal is zero. The potential of the second power signal is greater than or equal to 6 V and less than or equal to twelve V, e.g., generally 10 V. In this way, the foreign matter is reliably fused when the dark pixel defect occurs as a result of the foreign matter, such that the problem of the dark pixel defect is addressed.

Figure 3:
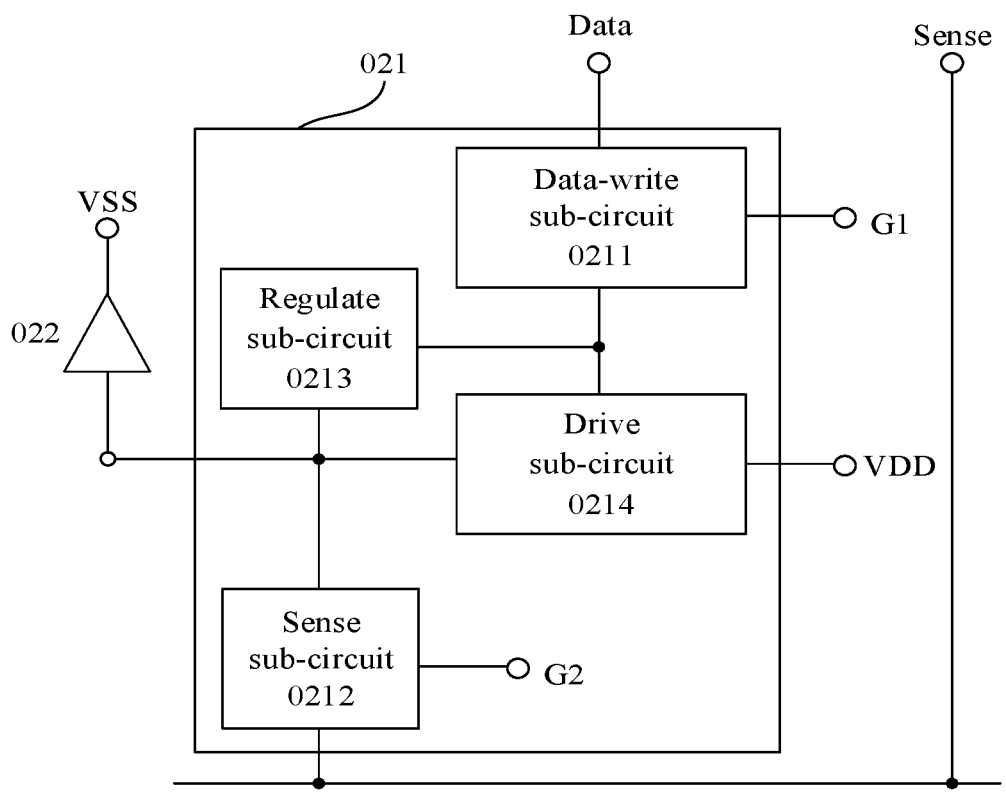
FIG. 3 is a schematic structural diagram of a pixel circuit according to some embodiments of the present disclosure.

Optionally, in some embodiments of the present disclosure, as illustrated in FIG. 1 and FIG. 2, the first electrode of the light-emitting element 022 is the anode and the second electrode of the light-emitting element 022 is the cathode, Optionally, FIG. 3 is a schematic structural diagram of a pixel circuit according to some embodiments of the present disclosure. As illustrated in FIG. 3, the pixel circuit 021 according to some embodiments of the present disclosure includes a data-write sub-circuit 0211, a sense sub-circuit 0212, a regulate sub-circuit 0213, and a drive sub-circuit 0214.

The data-write sub-circuit 0211 is coupled to a first gate line G1, a data line Data, and a control terminal of the drive sub-circuit 0214. Further, the data-write sub-circuit 0211 is configured to control, in response to a first gate drive signal supplied by the first gate line G1, conduction or cutoff between the control terminal of the drive sub-circuit 0214 and the data line Data.

For example, the data-write sub-circuit 0211 controls, in response to the potential of the first gate drive signal supplied by the first gate line G1 being a first potential, conduction between the control terminal of the drive sub-circuit 0214 and the data line Data. At this moment, the data line Data transmits a data signal to the control terminal of the drive sub-circuit 0214 to charge the control terminal of the drive sub-circuit 0214. The data-write sub-circuit 0211 controls, in response to the potential of the first gate drive signal supplied by the first gate line G1 being a second potential, the control terminal of the drive sub-circuit 0214 to be decoupled from the data line Data Optionally, in some embodiments of the present disclosure, the first potential is an effective potential, the second potential is an invalid potential, and the first potential is a high potential relative to the second potential.

The sense sub-circuit 0212 is coupled to a second gate line G2, a sense line Sense, and an output terminal of the drive sub-circuit 0214. Further, the sense sub-circuit 0212 is configured to control, in response to a second gate drive signal supplied by the second gate line G2, conduction or cutoff between the output terminal of the drive sub-circuit 0214 and the sense line Sense.

For example, the sense sub-circuit 0212 controls, in response to the potential of the second gate drive signal being the first potential, conduction between the output terminal of the drive sub-circuit 0214 and the sense line Sense. At this moment, the sense line Sense transmits a sense signal to the output terminal of the control drive sub-circuit 0214 to reset the output terminal of the drive sub-circuit 0214; or, the sense line Sense receives a potential of the output terminal of the control drive sub-circuit 0214. Further, the sense line Sense is coupled to an external compensation circuit and transmits the received potential to the external compensation circuit, such that the external compensation circuit externally compensates the data signal based on the potential, and thus the light-emitting element 022 is reliably lit. The sense sub-circuit 0212 controls, in response to the potential of the second gate drive signal being a second potential, the output terminal of the drive sub-circuit 0214 to be decoupled from the sense line Sense.

The regulate sub-circuit 0213 is coupled to the control terminal and the output terminal of the drive sub-circuit 0214. Moreover, the regulate sub-circuit 0213 is configured to regulate the potentials of the control terminal and the output terminal of the drive sub-circuit 0214.

An input terminal of the drive sub-circuit 0214 is coupled to a drive power line VDD, and the output terminal of the drive sub-circuit 0214 is further coupled to the first electrode of the light-emitting element 022. The drive sub-circuit 0214 is configured to transmit a drive signal to the first electrode of the light-emitting element 022 based on a drive power signal supplied by the drive power line VDD and a signal of the control terminal.

Based on the above structure, the second power line V2 according to some embodiments of the present disclosure is the sense line Sense. That is, the pixel circuit 02 is further coupled to the second power line V2 to transmit the drive signal to the light-emitting element 022 based on the second power signal supplied by the second power line V2. Alternatively, in other embodiments, the second power line V2 is the drive power line VDD; or another signal line capable of supplying the potential of the second power signal as described above, and the pixel circuit 02 is not coupled to the second power line V2. Descriptions in the following embodiments are given using a scenario where the second power line V2 is the sense line Sense as an example.

It should be noted that both the sense line Sense and the drive power line VDD that are employed as the second power line V2 are in common that they are DC power lines, i.e., the signals supplied are DC signals. Moreover, combined with an operating principle of the sense sub-circuit 0212, it is known that, in the case the pixel 02 is lit normally, a potential of the sense signal supplied by the sense line Sense is generally low, about zero V or below. Therefore, in some embodiments of the present disclosure, on the basis that the sense line Sense is employed as the second power line V2, it is also necessary to load a large potential of about ten V to the sense line Sense when repairing the dark pixel defect. Optionally, a circuit for loading the large potential to the sense line Sense is the external compensation circuit described above or is another external drive circuit.

Figure 4:
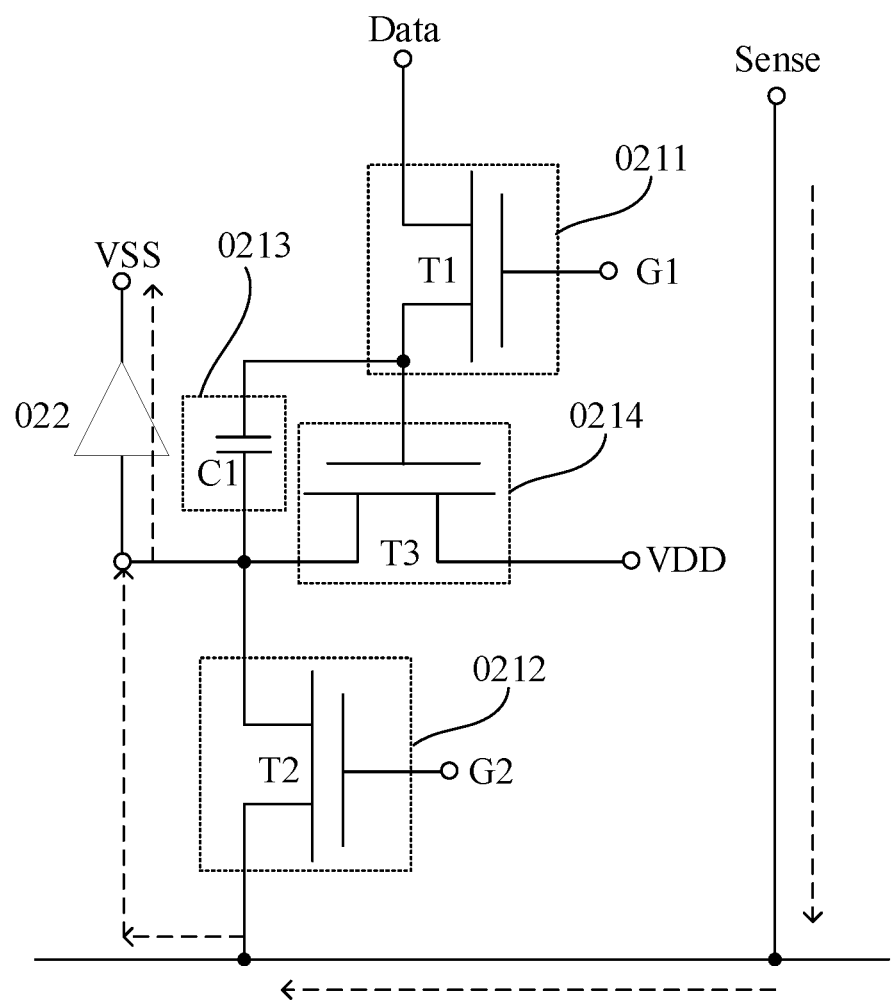
FIG. 4 is a schematic structural diagram of another pixel circuit according to some embodiments of the present disclosure.

Optionally, FIG. 4 is a schematic structural diagram of another pixel circuit according to some embodiments of the present disclosure. As illustrated in FIG. 4, the data-write sub-circuit 0211 includes a first transistor T1. The sense sub-circuit 0212 includes a second transistor T2. The regulate sub-circuit 0213 includes a storage capacitor C1. The drive sub-circuit 0214 includes a third transistor T3.

A gate electrode of the first transistor T1 is coupled to the first gate line G1, a first electrode of the first transistor T1 is coupled to the data line Data, and a second electrode of the first transistor T1 is coupled to a gate electrode of the third transistor T3.

A gate electrode of the second transistor T2 is coupled to the second gate line G2, a first electrode of the second transistor T2 is coupled to the sense line Sense, and a second electrode of the second transistor T2 is coupled to a second electrode of the third transistor T3.

One terminal of the storage capacitor C1 is coupled to the gate electrode of the third transistor T3, and the other terminal of the storage capacitor C1 is coupled to the second electrode of the third transistor T3.

A first electrode of the third transistor T3 is coupled to the drive power line VDD, and the second electrode of the third transistor T3 is further coupled to the first electrode of the light-emitting element 022.

The first transistor T1 is also referred to as a data-write transistor. The second transistor T2 is also referred to as a sense transistor. The third transistor T3 is also referred to as a drive transistor. Referring to FIG. 3 and FIG. 4, the control terminal of the drive sub-circuit 0214 is the gate electrode of the drive transistor, the input terminal of the drive sub-circuit 0214 is the first electrode of the drive transistor, and the output terminal of the drive sub-circuit 0214 is the second electrode of the drive transistor.

According to a current-limiting effect of the transistor, in the repair of the dark pixel defect, the second power signal with the large potential applied to the sense line Sense is capable of directly being across the second transistor T2 (i.e., the sense transistor) to the anode of the light-emitting element 022 to achieve the purpose of reliably burning out the foreign matter, and a signal flow direction is indicated by the dashed arrow in FIG. 4. That is, it is experimentally verified that, although the current-limiting of the sense transistor is small and a small current is not capable of burning out the foreign matter, a success rate of burning out the foreign matter is up to 100% upon bridging of the sense transistor.

Optionally, in the first electrode and the second electrode of each of the above transistors, one is a source electrode and the other is a drain electrode. Descriptions in the embodiments of the present disclosure are given using a scenario where the first electrode is the source electrode and the second electrode is the drain electrode. The first transistor T1, the second transistor T2, and the third transistor T3 are N-type transistors, or P-type transistors, or parts of them are N-type transistors and parts of them are P-type transistors.

For the N-type transistor, an effective potential (i.e., the first potential) is a high potential relative to an invalid potential (i.e., the second potential). For the P-type transistor, an effective potential (i.e., the first potential) is a low potential relative to an invalid potential (i.e., the second potential).

It should be noted that the structure illustrated in FIG. 4 is referred to as a 3T1C structure, i.e., including three transistors and one capacitor. In other embodiments, on the premise of satisfying the above embodiments, the pixel circuit 021 may be other structures, such as a 6T2C structure including six transistors and two capacitors. Moreover, the pixel circuit 021 is not limited to including only the sub-circuits illustrated in FIG. 3 and FIG. 4. That is, the pixel circuit 021 further includes other sub-circuits, such as a light-emitting control sub-circuit, which is not limited herein.

Figure 5:
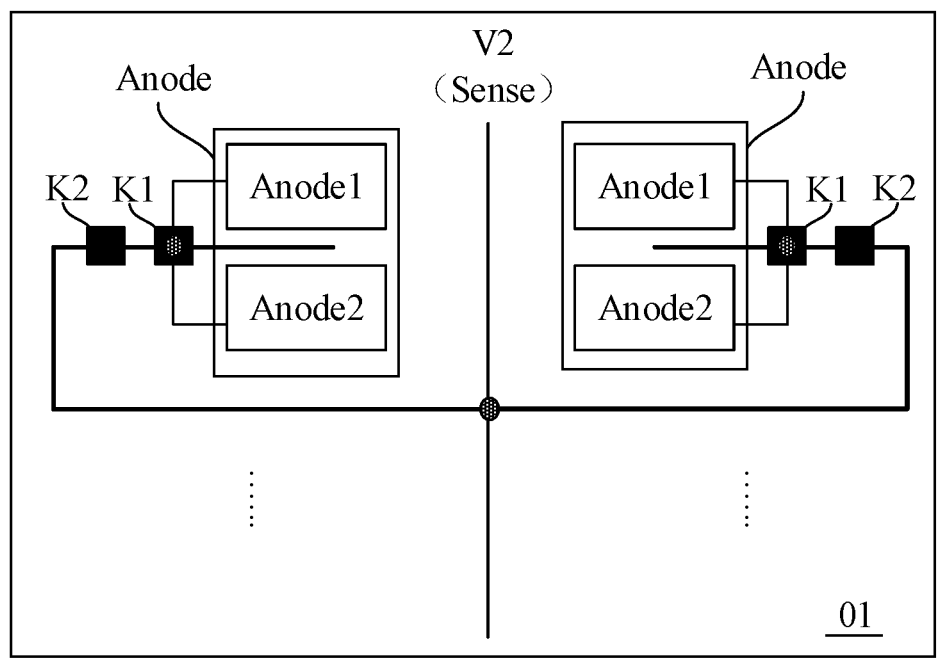
FIG. 5 is a schematic equivalent diagram of a partial structure of another display substrate according to some embodiments of the present disclosure.

Optionally, in some embodiments of the present disclosure, the first electrode of the light-emitting element 022 includes only a portion belonging to a whole. Alternatively, referring to another display substrate illustrated in FIG. 5, the first electrode of the light-emitting element 022 includes a first portion Anode1 and a second portion Anode2 that are spaced apart. That is, as described above, the anode of the light-emitting element 022 is divided into two using a partitioning design. In this way, a failure of only a portion of the anode to emit light normally does not affect the entire anode of the light-emitting element 022. Descriptions in the following embodiments are given using a scenario where the first electrode of the light-emitting element 022 includes the first portion Anode1 and the second portion Anode2 as an example.

Optionally, referring to FIG. 1, on the premise that the plurality of pixels 02 are arranged in arrays, the first portion Anode1 and the second portion Anode2 in the first electrode of the light-emitting element 022 are spaced apart along a column direction. In other embodiments, the first portion Anode1 and the second portion Anode2 are spaced apart along other directions, such as a row direction. The arrangement of the first portion Anode1 and the second portion Anode2 is not limited herein.

Optionally, the plurality of pixels 02 according to some embodiments of the present disclosure are of at least two colors, and at least two pixels 02 of a same color share a same repair line RL. Referring to FIG. 2, sharing a same repair line RL herein means that the first electrodes of the light-emitting elements 022 in the at least two pixels 02 of the same color are overlapped with the same repair line RL, that is, are coupled to the second power line V2 by the same repair line RL.

Figure 6:
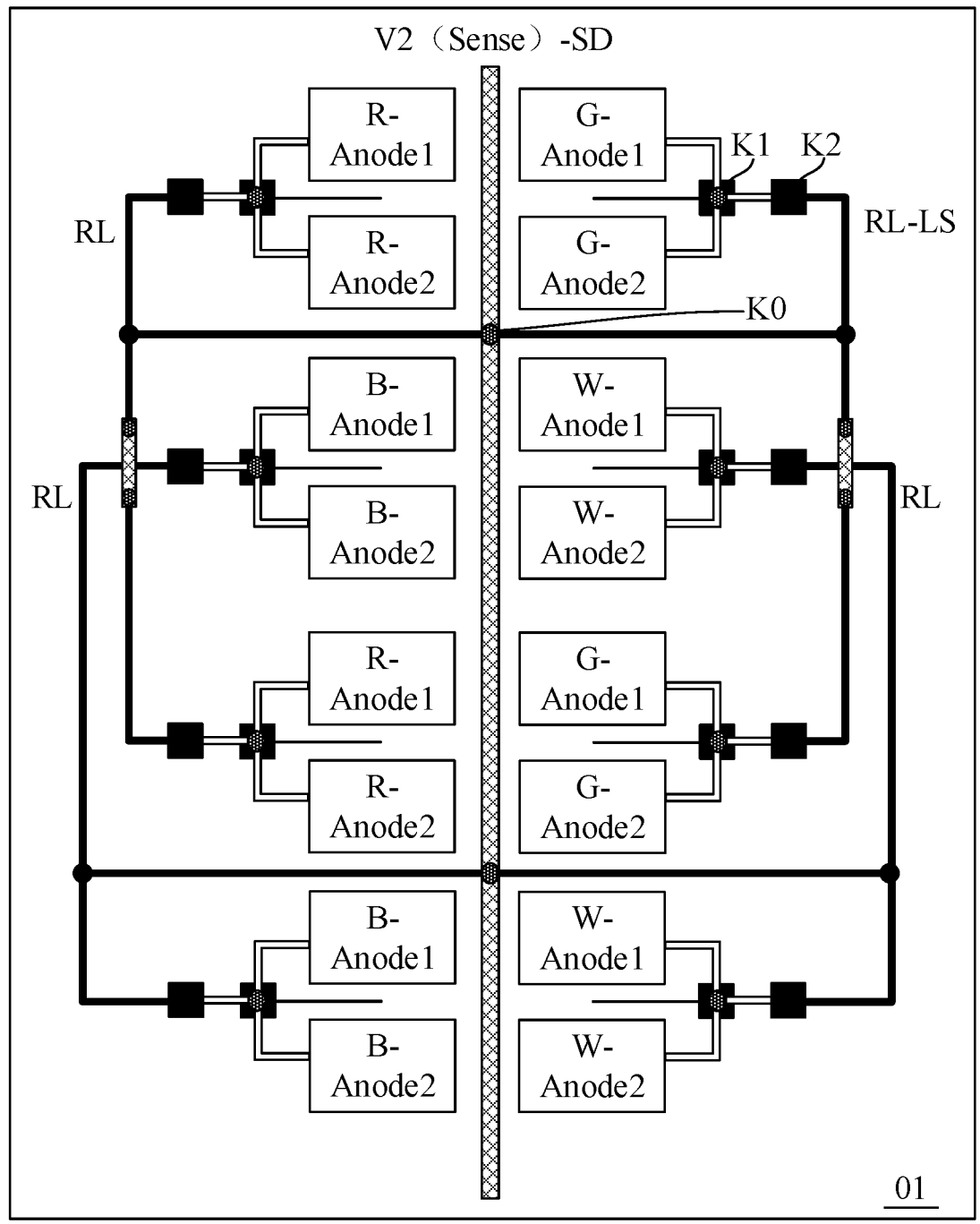
FIG. 6 is a schematic equivalent diagram of a partial structure of still another display substrate according to some embodiments of the present disclosure.

For example, referring to FIG. 6, the plurality of pixels 02 illustrated in FIG. 6 are of three colors, which respectively are red (R), green (G), and blue (B). That is, the display substrate includes a plurality of red pixels, a plurality of green pixels, and a plurality of blue pixels.

Each adjacent two pixels 02 of the same color illustrated in FIG. 6 share the same repair line RL. The term "adjacent" herein refers to being adjacent in the column direction. Each of the pixels 02 corresponds to only one of the repair lines RL. That is, different repair lines RL are shared by different two pixels 02, which facilitates the wiring.

Based on the above coupling, the repair line RL according to some embodiments of the present disclosure is further configured to couple the first electrode of the light-emitting element 022 in the defective pixel to a first electrode of a light-emitting element 022 in a normal pixel 02. The normal pixel 02 and the defective pixel share a same repair line RL and are of a same color. For example, for the structure illustrated in FIG. 6, the normal pixel 02 and the defective pixel 02 are two pixels 02 in a same column and adjacent to each other. The defective pixel includes a bright pixel in addition to the dark pixel.

In the case that the repair line RL couples the first electrode of the light-emitting element 022 in the defective pixel to the first electrode of the light-emitting element 022 in the normal pixel 02, the first electrode of the light-emitting element 022 in the defective pixel is decoupled from a pixel circuit 021 in the defective pixel and the second power line V2.

Exemplarily, the laser welding process is performed to weld the repair line RL to both the first electrode of the light-emitting element 022 in the defective pixel and the first electrode of the light-emitting element 022 in the normal pixel 02, such that the first electrode of the light-emitting element 022 in the defective pixel is reliably coupled to the first electrode of the light-emitting element 022 in the normal pixel 02 by the repair line RL. Some cutting processes are performed to decouple the first electrode of the light-emitting element 022 in the defective pixel from both the pixel circuit 021 in the defective pixel and the second power line V2. For example, a laser cutting process is performed to disconnect the first electrode of the light-emitting element 022 in the defective pixel from the pixel circuit 021 in the defective pixel and the second power line V2, such that the coupling is disconnected. Optionally, the pixel circuit 021 is decoupled from the second power line V2 by cutting the repair line RL.

In conjunction with the above embodiments, it is known that causes to the bright pixel include the abnormality of the transistor or the capacitor in the pixel circuit 021 illustrated in FIG. 4; and causes to the dark pixel include the abnormality of the transistor or the capacitor.

In this way, when the dark pixel defect or the bright pixel defect is caused by the transistor or the capacitor, by disconnecting the coupling between the pixel circuit 021 and the light-emitting element 022 that are in the defective pixel and using the repair line RL to couple the first electrode of the light-emitting element 022 in the defective pixel to the first electrode of the light-emitting element 022 in the normal pixel, the pixel circuit coupled to the first electrode of the light-emitting element 022 in the normal pixel is capable of transmitting the drive signal to the first electrode of the light-emitting element 022 in the defective pixel to reliably drive the defective pixel to emit light normally. In this way, the problem of poor display is addressed.

It should be noted that the first electrode of the light-emitting element 022 in the defective pixel is decoupled from the second power line V2, provided that the first electrode of the light-emitting element 022 in the defective pixel has been coupled, by the repair line RL, to the second power line V2 heretofore. That is, the defective pixel is the dark pixel. In the case that the defective pixel itself is the bright pixel, there is no need to couple the second power line V2 to the first electrode of the light-emitting element 022 by the repair line RL first. Thus, it is also not necessary to decouple the first electrode of the light-emitting element 022 from the second power line V2.

Combined with the above embodiments, in some embodiments of the present disclosure, in the case that the dark pixel appears, the repair line RL coupled to the second power line V2 is first welded to the first electrode of the light-emitting element 022 in the dark pixel by the laser welding process, and the second power signal with a large potential is transmitted to the first electrode of the light-emitting element 022 by the second power line V2. The foreign matter is fused and is exhibited, i.e., shown, in the case that the dark pixel defect is caused by the foreign matter. Therefore, whether the dark pixel defect is caused by the foreign matter or the abnormality of the transistor or the capacitor is reliably determined by observing whether fused foreign matter is exhibited. Based on this, according to the method, even if the foreign matter is too small to be observed by a microscope, the foreign matter is burnt out and is exhibited.

Further, in the case that the foreign matter is exhibited, i.e., it is determined that the dark pixel defect is caused by the foreign matter, at this point, the fused foreign matter causes the first electrode of the light-emitting element 022 to be no longer short-circuited to the second electrode, and the dark pixel is restored to the normal pixel. Afterward, the second power line V2 is decoupled from the first electrode of the light-emitting element 022 by the laser cutting process, such that the second power line V2 no longer transmits the second power signal to the first electrode of the light-emitting element 022, and the first electrode of the light-emitting element 022 re-receives the drive signal supplied by the pixel circuit 021 to emit light normally. In the case that the foreign matter is not exhibited, the first electrode of the light-emitting element 022 in the dark pixel is decoupled from the pixel circuit 021 and the second power line V2 by the laser cutting process, and the repair line RL is welded to the first electrode of the light-emitting element 022 in the dark pixel and the first electrode of the light-emitting element 022 in the normal pixel by the laser welding process, such that the first electrode of the light-emitting element 022 in the dark pixel is coupled to the first electrode of the light-emitting element 022 in the normal pixel 02, and thus the pixel circuit in the normal pixel transmits the drive signal to the first electrode of the light-emitting element 022 in the dark pixel to drive the dark pixel to emit light normally. In this way, the problem of the dark pixel defect is addressed.

In the case that the bright pixel defect is caused by the abnormality of the transistor or capacitor, the first electrode of the light-emitting element 022 in the dark pixel is decoupled from the pixel circuit 021 by the laser cutting process, and the repair line RL is welded to the first electrode of the light-emitting element 022 in the dark pixel and the first electrode of the light-emitting element 022 in the normal pixel by the laser welding process, such that the first electrode of the light-emitting element 022 in the dark pixel is coupled to the first electrode of the light-emitting element 022 in the normal pixel 02, and thus the pixel circuit in the normal pixel transmits the drive signal to the first electrode of the light-emitting element 022 in the dark pixel to drive the bright pixel to emit light normally. In this way, the problem of the bright pixel defect is addressed.

Figure 7:
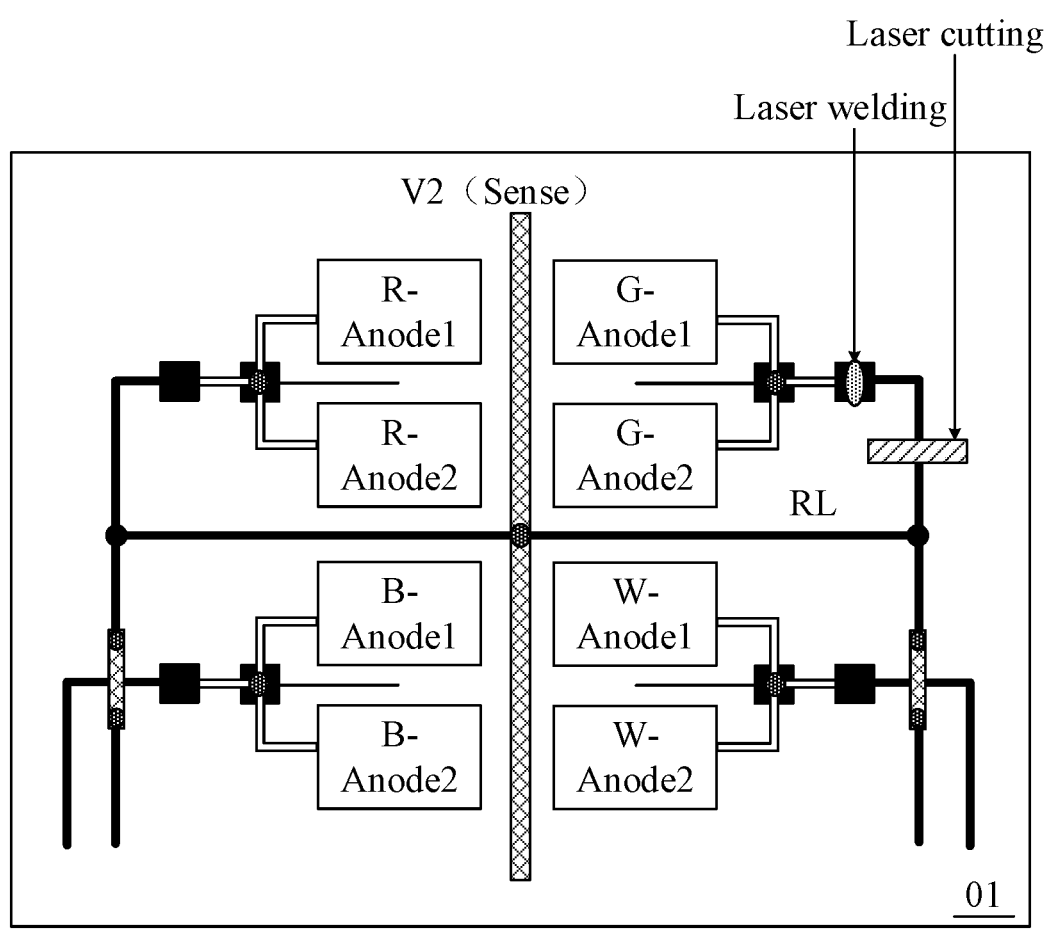
FIG. 7 is a repair equivalent diagram for a display substrate according to some embodiments of the present disclosure.

Exemplarily, based on FIG. 6, referring to the process equivalent diagram of FIG. 7, the repair method is further described using a scenario where the dark pixel defect in a green G pixel is caused by the foreign matter as an example. First, at the second via K2 corresponding to the anode (including a G-Anode 1 and a G-Anode 2) of the green G pixel, the repair line RL is welded to the anode of the green G pixel by the laser welding process. Then, a potential of about 10 V is applied to the second power line V2 (i.e., the sense line Sense) to burn out the foreign matter, such that the anode of the green G pixel is no longer short-circuited to the cathode. Finally, the repair line RL is cut by the laser cutting process to disconnect the coupling between the second power line V2 and the anode of the green G pixel, and the pixel circuit 021 is employed to reliably drive the green G pixel to emit light. As a result, the dark pixel is repaired as the normal pixel.

Figure 8:
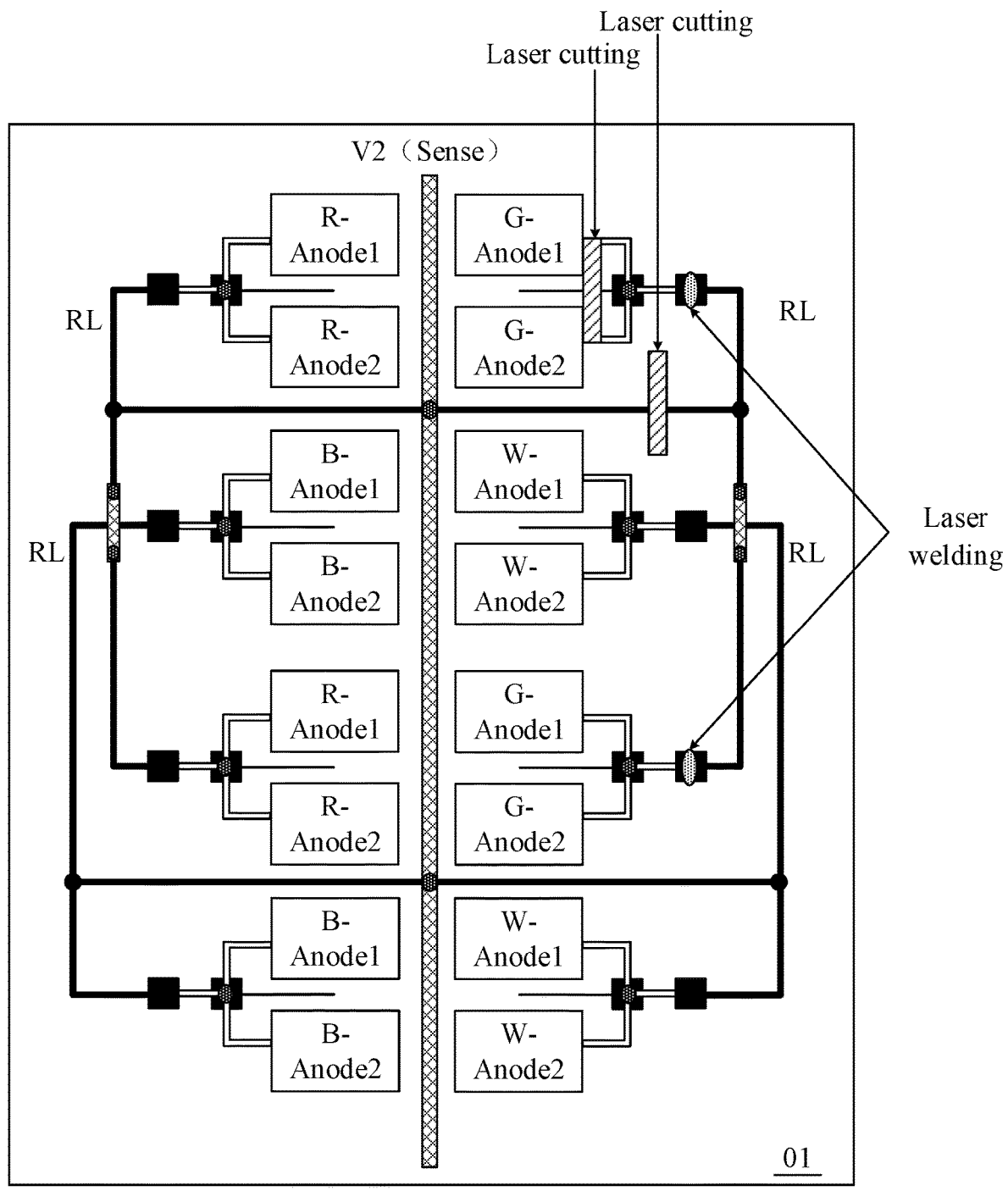
FIG. 8 is another repair equivalent diagram for a display substrate according to some embodiments of the present disclosure.

Exemplarily, based on FIG. 6, referring to the process equivalent diagram of FIG. 8, the repair method is further described using a scenario where the dark pixel defect in a green G pixel is caused by the abnormality of the transistor or capacitor as an example. First, the repair line RL is cut by the laser cutting process to disconnect the coupling between the second power line V2 and the anode of the dark green G pixel. Then, the coupling between the anode of the dark green G pixel and the pixel circuit 021 in the dark green G pixel is disconnected by the laser cutting process. Finally, at the second via K2 corresponding to the anode of the dark green G pixel and the second via K2 corresponding to the anode of the normal green G pixel that shares the repair line RL with the dark green G pixel, the repair line RL is welded to the anode of the dark green G pixel and the anode of the normal green G pixel by the laser welding process, such that the anode of the dark green G pixel is coupled to the anode of the normal green G pixel. In this way, the pixel circuit 021 of the normal green G pixel transmits the drive signal to the dark green G pixel to drive the dark green G pixel to emit light normally. As a result, the dark pixel is repaired as the normal pixel. Moreover, in conjunction with the above embodiments, the method illustrated in FIG. 8 is performed in the case that the large potential is applied to the second power line V2, in FIG. 7, and the foreign matter is not exhibited.

It should be noted that the above sequence of cutting and welding illustrated in FIG. 8 is flexibly adjusted according to actual needs. As well as the cutting position and welding position are also flexibly arranged according to actual needs, only if the above coupling and decoupling methods are satisfied.

According to the above embodiments, in the embodiments of the present disclosure, the problems of the dark pixel defect and the bright pixel defect are reliably repaired without affecting an aperture ratio by only adding a repair line RL, such that all defective pixels are reliably repaired. When applied to transparent display products, a product yield is significantly improved. The repair method according to the embodiments of the present disclosure applies to the top-emitting display products and the transparent display products as described above, and also to bottom-emitting display products or non-transparent display products.

Optionally, the second power line V2 and the repair line RL according to some embodiments of the present disclosure are disposed in different layers, i.e., stacked along a direction away from the substrate. In this way, referring to FIG. 6 and FIG. 9, the display substrate further includes an insulator layer disposed between the second power line V2 and the repair line RL, and a via K0 running through the insulator layer. The second power line V2 is lapped to the repair line RL by the via K0. In other embodiments, the second power line V2 and the repair line RL are disposed in a same layer.

Figure 9:
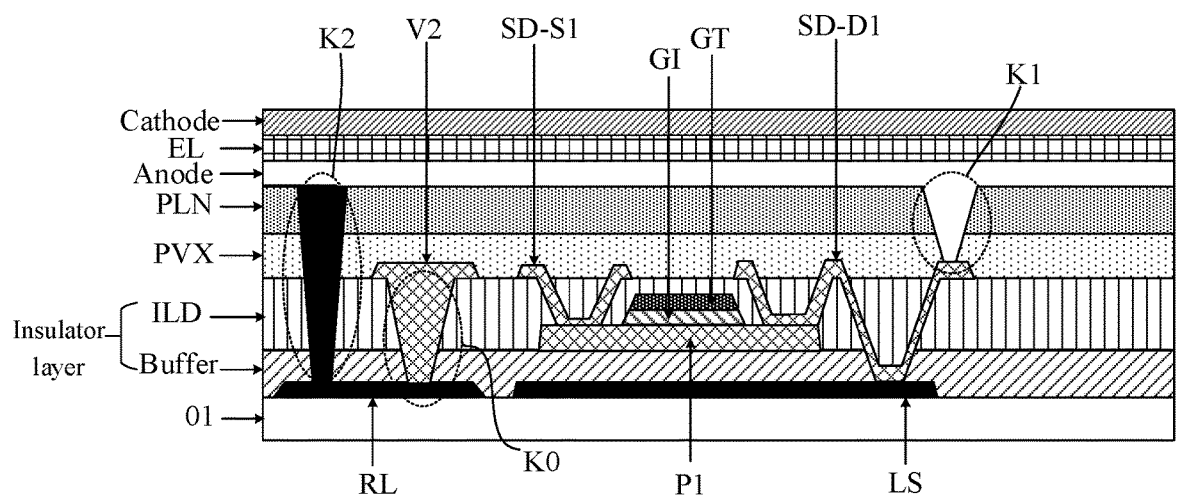
FIG. 9 is a film-layer diagram of a display substrate according to some embodiments of the present disclosure.

Optionally, referring to FIG. 9, the pixel circuit 021 includes an active layer P1, a gate insulator (GI) layer, a gate (Gate) metal layer GT, an inter-layer dielectric (ILD) layer, and a source-drain (SD) metal layer that are successively stacked along the direction away from the substrate 01. FIG. 9 illustrates the drive transistor, i.e., the third transistor T3, in the pixel circuit 021.

Optionally, the anode is disposed on a side, distal from the substrate 01, of the source-drain metal layer SD. The active layer P1, the gate insulator layer GI, the gate metal layer GT, the inter-layer di-electrical layer ILD, and the source-drain metal layer SD are successively stacked along the direction away from the substrate 01. That is, each of the transistors in the pixel circuit 021 is a transistor of a top-gate structure. In other embodiments, the transistor is a transistor of a bottom-gate structure.

Optionally, the display substrate further includes a light shield (LS) layer disposed between the substrate 01 and the active layer P1. In some embodiments of the present disclosure, the second power line V2 and the source-drain metal layer SD are disposed in a same layer, and the repair line RL and the light shield layer LS are disposed in a same layer.

It should be noted that the term "disposed in a same layer" refers to a layer structure, which is formed by forming a film layer of a particular pattern using a same film-forming process and then patterning the film layer by a one-time patterning process using a same mask. Depending on the specific pattern, the one-time patterning process includes multiple exposing, developing, or etching processes, and the specific pattern in the formed layer structure is continuous or discontinuous. That is, a plurality of components, parts, structures and/or portions disposed in a "same layer" are made of a same material and are formed by the one-time patterning process. In this way, the manufacturing process and manufacturing costs are saved, and the manufacturing efficiency is accelerated. That is, the second power line V2 and the source-drain metal layer SD are formed using a same material by the one-time patterning process. Similarly, the repair line RL and the light shield layer LS are formed using a same material by the one-time patterning process.

Referring to FIG. 9, the display substrate further includes a buffer layer Buffer disposed between the active layer P1 and the light shield layer LS, and a passivation (PVX) layer and a planarization (PLN) layer that are successively stacked between the source-drain metal layer SD and the anode. The source-drain metal layer SD includes a source electrode S1 and a drain electrode D1 that are disposed in a same layer and spaced apart. Therefore, the insulator layer disposed between the repair line RL and the light shield layer LS includes the inter-layer di-electrical layer ILD and the buffer layer Buffer. The second power line V2 is lapped to the repair line RL by the via K0 running through the inter-layer dielectric layer ILD and the buffer layer Buffer.

In other embodiments, the repair line RL and other conductive layers are disposed in the same layer. For example, the repair line RL and the gate metal layer Gate are disposed in the same layer. The second power line V2 and other conductive layers are disposed in the same layer. For example, the second power line V2 and the gate metal layer Gate are disposed in the same layer.

FIG. 9 further illustrates the cathode and a light-emitting layer EL. The cathode and the light-emitting layer EL are disposed on a side, distal from the substrate 01, of the anode and successively stacked along the direction away from the substrate 01. The source electrode S1 is lapped to the light shield layer LS by the via running through the inter-layer dielectric layer ILD and the buffer layer Buffer, such that voltages on the light shield layer LS and the source electrode S1 are the same, and thus a parasitic capacitance is avoided to be present between the light shield layer LS and other conductive structures. Moreover, an orthographic projection of the active layer P1 on the substrate 01 is overlapped with an orthographic projection of the light shield layer LS on the substrate 01. The light shield layer LS is employed to shield the active layer P1 to avoid a voltage threshold shift of the active layer P1 under irradiation of light. The light shield layer LS is further employed to shield the light to prevent external light from affecting the display. The source electrode S1 and the drain electrode D1 are lapped to the active layer P1 respectively by two vias running through the inter-layer di-electric ILD. The source electrode S1 is lapped to the anode by the via running through the passivation layer PVX and the planarization layer PLN. In this way, a drive signal is transmitted to the anode by the source electrode S1, and the light-emitting layer EL emits light under a voltage difference between the drive signal and the first power signal applied to the cathode.

Optionally, the active layer P1 is divided into a semiconductive region (also referred to as a channel region) and a conductive region (respectively referred to as a source region and a drain region, corresponding to the source electrode and the drain electrode) disposed on either side of the channel region. The semiconductive region is undoped or has a different type of doping from the source region and the drain region, and thus has semiconductor properties. The conductive region is doped and therefore has electrical conductivity. The doping impurities vary depending on the type of the transistor (i.e., an N-type or a P-type). The above source-drain metal layer SD is lapped to the conductive region.

Optionally, the substrate 01 includes a glass substrate or a flexible substrate. The flexible substrate is made of polyimide. The buffer layer Buffer, the passivation layer PVX, and the gate insulator layer GI are made of an inorganic material such as silicon nitride, silicon oxide, or silicon nitride. The inter-layer dielectric layer ILD is made of silicon dioxide, silicon nitride, or a mixture of the silicon dioxide and the silicon nitride. The planarization layer PLN is made of a resin. The light-emitting layer EL is made of an organic electro-luminescent (EL) material. The anode is made of indium tin oxide (ITO). The cathode is made of indium zinc oxide (IZO). The light shield layer LS, the gate metal layer GT and the source-drain metal layer SD are made of a metal material such as aluminum, silver, molybdenum, or an alloy. The active layer P1 is made of a semiconductor material such as polycrystalline silicon, amorphous silicon, or an oxide semiconductor.

In summary, some embodiments of the present disclosure provide a display substrate. The display substrate includes the plurality of pixels, the second power line, and the repair line that are disposed on a side of the substrate. The second power line is coupled to the repair line, and the repair line is configured to couple the second power line to the first electrode of the light-emitting element in the defective pixel, such that the second power line transmits the second power signal to the first electrode of the light-emitting element. The potential of the second power signal is greater than the potential of the first power signal supplied by the first power line coupled to the second electrode of the light-emitting element. In this way, by flexibly arranging the potential of the second power signal, the foreign matter is reliably burnt out in the case that the dark pixel appears because of the short-circuit between the first electrode and the second electrode of the light-emitting element as a result of the foreign matter. Therefore, the first electrode of the light-emitting element is no longer short-circuited to the second electrode, such that the problem of the dark pixel defect is addressed, and thus the better display effect of the display substrate is achieved.

Figure 10:
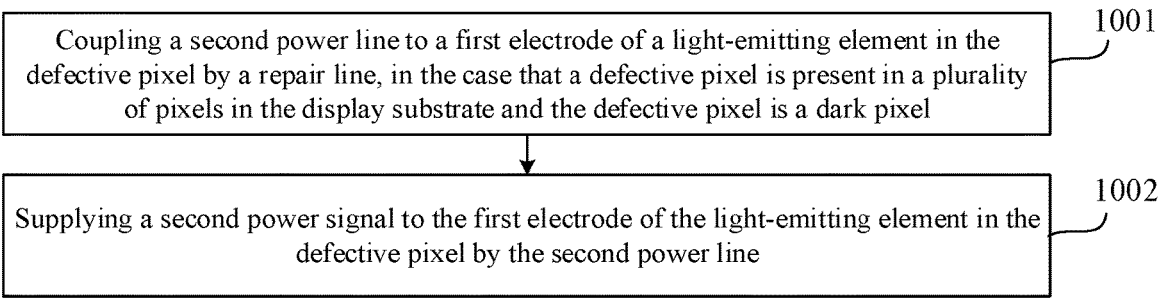
FIG. 10 is a flowchart of a method for repairing a display substrate according to some embodiments of the present disclosure.

FIG. 10 is a flowchart of a method for repairing a display substrate according to some embodiments of the present disclosure. The method is employed to repair the display substrate as illustrated in the above accompanying drawings. As illustrated in FIG. 10, the method includes the following steps.

In step 1001, in the case that a defective pixel is present in a plurality of pixels in the display substrate and the defective pixel is a dark pixel, a second power line is coupled to a first electrode of a light-emitting element in the defective pixel by a repair line.

Optionally, in conjunction with FIG. 7 and the above embodiments, the repair line RL is welded to the first electrode of the light-emitting element 022 in the defective pixel by a laser welding process, such that the second power line V2 is coupled to the first electrode of the light-emitting element 022 in the defective pixel by the repair line RL.

In step 1002, a second power signal is supplied to the first electrode of the light-emitting element in the defective pixel by the second power line.

A potential of the second power signal is greater than a potential of the first power signal supplied by the first power line coupled to the second electrode of the light-emitting element. In this way, in the case that the dark pixel defect is caused by foreign matter, the foreign matter is reliably burned out, such that the first electrode is no longer short-circuited to the second electrode of the light-emitting element, and thus the problem of the dark pixel defect is addressed.

Figure 11:
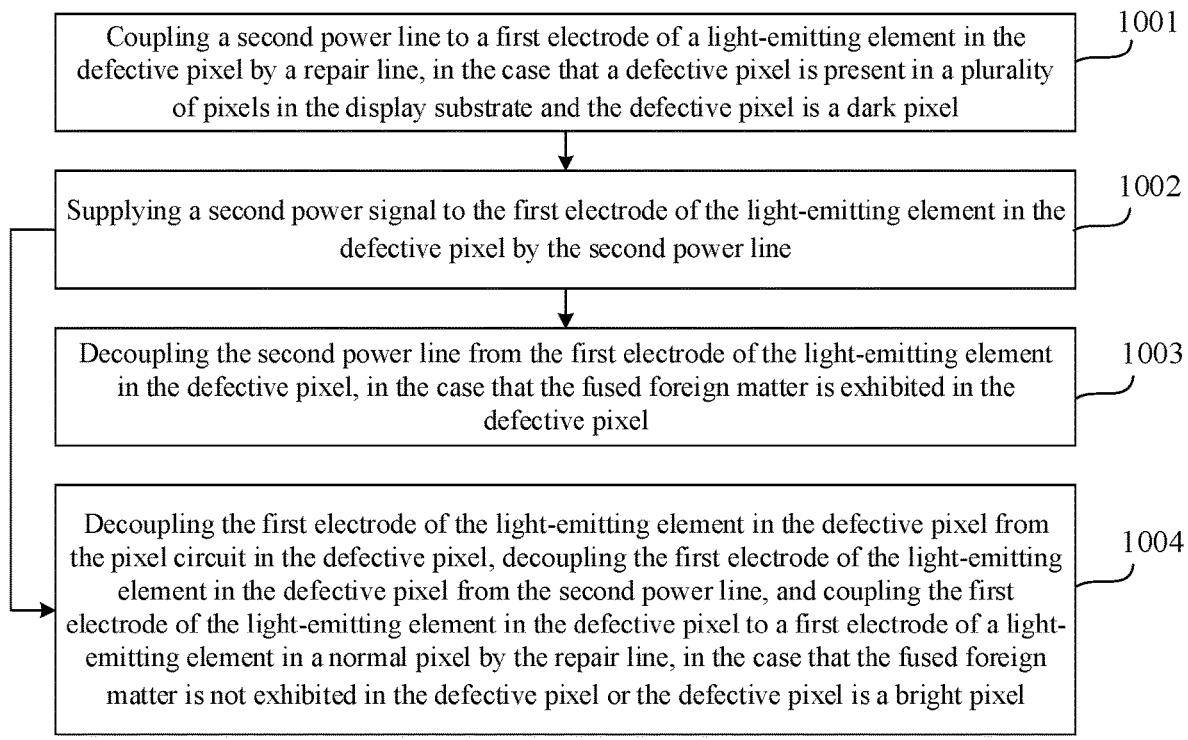
FIG. 11 is a flowchart of another method for repairing a display substrate according to some embodiments of the present disclosure.

FIG. 11 is a flowchart of another method for repairing a display substrate according to some embodiments of the present disclosure. Referring to FIG. 10 and FIG. 11, upon step 1002, the method further includes the following steps.

In step 1003, in the case that the fused foreign matter is exhibited in the defective pixel, the second power line is decoupled from the first electrode of the light-emitting element in the defective pixel.

As described above, in the case that the fused foreign matter is exhibited in the defective pixel, it is determined that the dark pixel defect is the result of the short circuit between the first electrode and the second electrode of the light-emitting element caused by the foreign matter. In this case, upon burning out the foreign matter, the second power line is decoupled from the first electrode of the light-emitting element in the defective pixel, such that the second power line no longer transmits the second power signal with a large potential to the first electrode of the light-emitting element. The pixel circuit 021 re-supplies a drive signal to the first electrode of the light-emitting element normally to drive the light-emitting element to reliably emit light.

Optionally, in conjunction with FIG. 7 and the embodiments described above, the repair line RL is cut by a laser cutting process, such that the second power line V2 is decoupled from the first electrode of the light-emitting element 022 in the defective pixel.

In step 1004, in the case that the fused foreign matter is not exhibited in the defective pixel or the defective pixel is a bright pixel, the first electrode of the light-emitting element in the defective pixel is decoupled from the pixel circuit in the defective pixel, the first electrode of the light-emitting element in the defective pixel is decoupled from the second power line, and the first electrode of the light-emitting element in the defective pixel is coupled to a first electrode of a light-emitting element in a normal pixel by the repair line.

As described above, in the case that the foreign matter is not exhibited in the defective pixel, it is determined that the dark pixel defect is the result of abnormality of a transistor or a capacitor. At this moment, the first electrode of the light-emitting element in the defective pixel is decoupled from the pixel circuit in the defective pixel, the first electrode of the light-emitting element in the defective pixel is decoupled from the second power line, and the first electrode of the light-emitting element in the defective pixel is coupled to the first electrode of the light-emitting element in the normal pixel by the repair line. In this way, the pixel circuit in the normal pixel supplies the drive signal to the light-emitting element in that defective pixel to drive the light-emitting element in the defective pixel to reliably emit light. In this case, the normal pixel and the defective pixel share a same repair line and are of a same color. In the case that the defective pixel is the bright pixel, step 1004 is directly performed without performing steps 1001 to 1003.

Optionally, in conjunction with FIG. 8 and the embodiments described above, the repair line RL is welded to the first electrode of the light-emitting element 022 in the defective pixel and the first electrode of the light-emitting element 022 in the normal pixel by the laser welding process, such that the first electrode of the light-emitting element 022 in the defective pixel is coupled to the first electrode of the light-emitting element 022 in the normal pixel. The first electrode of the light-emitting element 022 in the defective pixel is decoupled from the pixel circuit 021 in the defective pixel and the second power line V2 by the laser cutting process.

In summary, some embodiments of the present disclosure provide a method for repairing a display substrate. According to the method, in the case that the defective pixel appears and the defective pixel is the dark pixel, the second power line is coupled to the first electrode of the light-emitting element in the defective pixel by the repair line, and the second power signal is supplied to the first electrode of the light-emitting element in the defective pixel by the second power line. Moreover, the potential of the second power signal is greater than the potential of the first power signal supplied by the first power line coupled to the second electrode of the light-emitting element. In this way, by flexibly arranging the potential of the second power signal, the foreign matter is reliably burnt out in the case that the dark pixel appears because of the short-circuit between the first electrode and the second electrode of the light-emitting element as a result of the foreign matter. Therefore, the first electrode of the light-emitting element is no longer short-circuited to the second electrode, such that the problem of the dark pixel defect is addressed, and thus the display effect of the display substrate according to the embodiments of the present disclosure is better.

In addition, in the method, in the case that the foreign matter is exhibited upon supplying the second power signal to the first electrode of the light-emitting element in the defective pixel by the second power line, the second power line is further decoupled from the first electrode of the light-emitting element in the defective pixel, such that the second power line stops supplying the second power signal with a large potential to the defective pixel, and thus the pixel is ensured to emit light subsequently. In the case that foreign matter is not exhibited, the first electrode of the light-emitting element in the defective pixel is further decoupled from the pixel circuit in the defective pixel, the first electrode of the light-emitting element in the defective pixel is decoupled from the second power line, and the first electrode of the light-emitting element in the defective pixel is coupled to the first electrode of the light-emitting element in the normal pixel by the repair line. In this way, the problem of the defect caused by the abnormality of the transistor or capacitor in the pixel circuit is reliably addressed.

Figure 12:
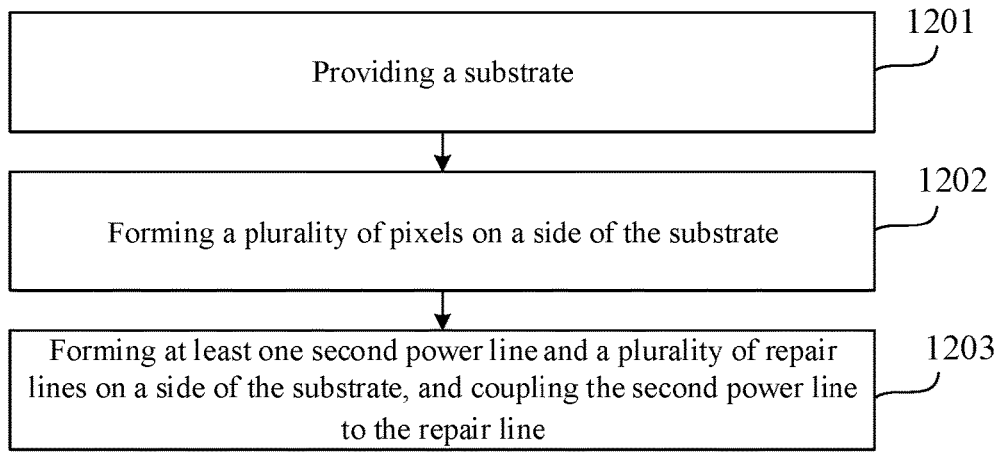
FIG. 12 is a flowchart of a method for preparing a display substrate according to some embodiments of the present disclosure.

FIG. 12 is a flowchart of a method for preparing a display substrate according to some embodiments of the present disclosure. The method is applicable to preparing the display substrate as illustrated in the above accompanying drawings. As illustrated in FIG. 12, the method includes the following steps.

In step 1201, a substrate is provided.

Optionally, as described above, the provided substrate 01 is a glass substrate or a flexible substrate.

In step 1202, a plurality of pixels are formed on a side of the substrate.

Each of the pixels includes a pixel circuit and a light-emitting element. The pixel circuit is coupled to a first electrode of the light-emitting element. A second electrode of the light-emitting element is coupled to a first power line. The pixel circuit is configured to transmit a drive signal to the first electrode of the light-emitting element. The light-emitting element is configured to emit light based on the drive signal and the first power signal supplied by the first power line.

Optionally, referring to FIG. 9, by a one-time patterning process, an active layer, a gate insulator layer, a gate metal layer, and a source-drain metal layer are formed on a side of the substrate to form the pixel circuit; and an anode, a light-emitting layer, and a cathode are formed on a side of the substrate to form the light-emitting element. The one-time patterning process includes photoresist coating, exposing, developing, etching, and photoresist stripping.

In step 1203, at least one second power line and a plurality of repair lines are formed on a side of the substrate, and the second power line is coupled to the repair line.

An orthographic projection of the repair line on the substrate is overlapped with an orthographic projection of the first electrode of the light-emitting element on the substrate. The repair line is configured to couple the second power line to a first electrode of a light-emitting element in a defective pixel in the plurality of pixels, and the second power line is configured to transmit a second power signal to the first electrode of the coupled light-emitting element by the repair line. The defective pixel includes a dark pixel, and a potential of the second power signal is greater than a potential of the first power signal.

In addition, the repair line is configured to couple the first electrode of the light-emitting element in the defective pixel to a first electrode of a light-emitting element in a normal pixel, wherein the normal pixel and the defective pixel share a same repair line and are of a same color, and the defective pixel includes a bright pixel. In the case that the repair line couples the first electrode of the light-emitting element in the defective pixel to the first electrode of the light-emitting element in the normal pixel, the first electrode of the light-emitting element in the defective pixel is decoupled from the pixel circuit in the defective pixel and the second power line.

Optionally, referring to FIG. 9, by the one-time patterning process, the repair line RL is formed while forming a light shield layer LS; and the second power line V2 is formed while forming the source-drain metal layer SD; and the second power line V2 of the different layers is lapped to the repair line RL by a via K0 running through an inter-layer li-electric layer ILD and a buffer layer Buffer.

In summary, some embodiments of the present disclosure provide a method for preparing a display substrate. According to the method, the plurality of pixels, the second power line, and the repair line are formed on a side of the substrate, and the second power line is coupled to the repair line. The formed repair line is configured to couple the second power line to the first electrode of the light-emitting element in the defective pixel, such that the second power line supplies the second power signal to the first electrode of the light-emitting element. Moreover, the potential of the second power signal is greater than the potential of the first power signal supplied by the first power line coupled to the second electrode of the light-emitting element. In this way, by flexibly arranging the potential of the second power signal, the foreign matter is reliably burnt out in the case that the dark pixel appears because of the short-circuit between the first electrode and the second electrode of the light-emitting element as a result of the foreign matter. Therefore, the first electrode of the light-emitting element is no longer short-circuited to the second electrode, such that the problem of the dark pixel defect is addressed, and thus the display effect of the display substrate according to the embodiments of the present disclosure is better.

Figure 13:
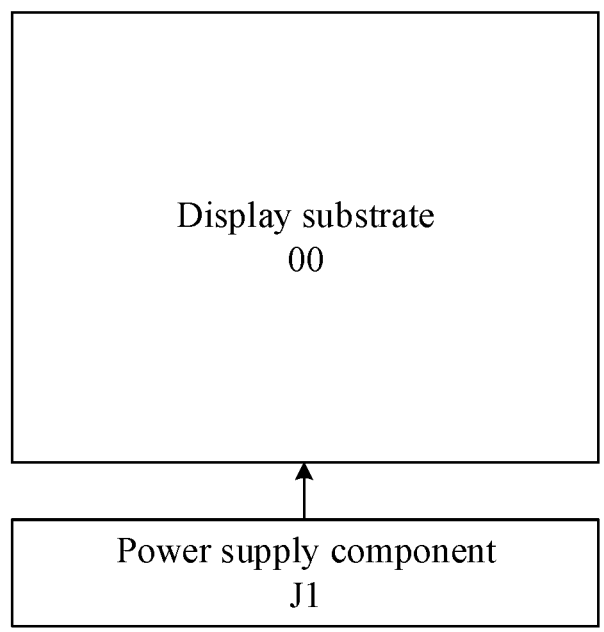
FIG. 13 is a schematic structural diagram of a display device according to some embodiments of the present disclosure.

FIG. 13 is a schematic structural diagram of a display device according to some embodiments of the present disclosure. As illustrated in FIG. 13, the display device includes a power supply component J1 and a display substrate 00 as illustrated in the above accompanying drawings.

The power supply component J1 is coupled to the display substrate 00 and is configured to supply power to the display substrate 00.

Optionally, the display device is a smartphone, a tablet computer, a television, a display, a notebook computer, a digital photo frame, a navigator or a transparent display product, and any other product or component with a display function. The transparent display product applies to vehicle displays such as cars or subways and applies to window displays such as hotels or clothing stores, which have the advantages of clear picture quality and realistic display effects.

It should be noted that in the accompanying drawings, sizes of layers and regions may be exaggerated for clearer illustration. It should be understood that where an element or layer is referred to as being "on" another element or layer, the element or layer may be directly on another element, or intervening layers therebetween may be present. In addition, it should be understood that where an element or layer is referred to as being "under" another element or layer, the element or layer may be directly under the other element, or there may be more than one intervening layer or element. In addition, it may be further understood that in the case that a layer or element is referred to as being "between" two layers or two elements, the layer may be the only layer between the two layers or two elements, or more than one intervening layer or element may further be present. Like reference numerals indicate like elements throughout.

The terms used in the detailed description of the present disclosure are merely for interpreting, instead of limiting, the embodiments of the present disclosure. It should be noted that unless otherwise defined, technical or scientific terms used in the embodiments of the present disclosure shall have ordinary meanings understandable by persons of ordinary skill in the art to which the disclosure belongs.

For example, in the present disclosure, the terms "first" and "second" are only used for descriptive purposes, and cannot be understood as indicating or implying relative importance. The term "a plurality of" refers to two or more, unless expressly defined otherwise.

Similarly, the terms "first," "second," and the like are not intended to indicate any quantitative limit, but the presence of at least one.

The terms "comprise," "include," and derivatives or variations thereof are used to indicate that the element or object preceding the terms covers the element or object following the terms and its equivalents, and shall not be understood as excluding other elements or objects.

The terms "on," "under," "left," "right" "top," and "bottom" are only used to indicate the relative positional relationship. When the absolute position of the described object changes, the relative positional relationship may change accordingly.

The term "and/or" indicates three relationships between contextual objects. For example, A and/or B may mean that A exists alone, A and B exist at the same time, and B exists alone. The symbol "/" generally denotes an "OR" relationship between contextual objects.

Described above are not intended to construe any limitation to the present disclosure in any form. Although the present disclosure has been disclosed with reference to the embodiments, described above are not intended to limit the present disclosure. Changes or modifications may be made, within the scope of the technical solutions of the present disclosure, by those skilled in the art to be the equivalent embodiments of equivalent changes by using the technical content disclosed above. However, any simple modifications and equivalent changes and modifications made based on the technical substance of the present disclosure shall be included in the scope of the technical solutions of the present disclosure.

What is claimed is:

1. A display substrate, comprising:
   a substrate;
   a plurality of pixels, disposed on a side of the substrate, each of the pixels comprising a pixel circuit and a light-emitting element, wherein the pixel circuit is coupled to a first electrode of the light-emitting element, a second electrode of the light-emitting element is coupled to a first power line, the pixel circuit is configured to transmit a drive signal to the first electrode of the light-emitting element, and the light-emitting element is configured to emit light based on the drive signal and a first power signal supplied by the first power line; and
   at least one second power line and a plurality of repair lines that are disposed on a side of the substrate, wherein the second power line is coupled to the repair line, an orthographic projection of the repair line on the substrate being overlapped with an orthographic projection of the first electrode of the light-emitting element on the substrate, the repair line is configured to couple the second power line to a first electrode of a light-emitting element in a defective pixel in the plurality of pixels, and the second power line is configured to transmit a second power signal to the first electrode of the coupled light-emitting element by the repair line;
   wherein the defective pixel comprises a dark pixel, and a potential of the second power signal is greater than a potential of the first power signal.

2. The display substrate according to claim 1, wherein the potential of the first power signal is 0 V, and the potential of the second power signal is greater than 6 V and less than or equal to 12 V.

3. The display substrate according to claim 1, wherein
   the plurality of pixels are of at least two colors, and at least two pixels of a same color share a same one of the repair lines;
   the repair line is further configured to couple the first electrode of the light-emitting element in the defective pixel to a first electrode of a light-emitting element in a normal pixel, the normal pixel and the defective pixel sharing a same one of the repair lines and being of a same color, and the defective pixel comprising a bright pixel; and
   in response to the repair line coupling the first electrode of the light-emitting element in the defective pixel to the first electrode of the light-emitting element in the normal pixel, the first electrode of the light-emitting element in the defective pixel is decoupled from a pixel circuit in the defective pixel, and the first electrode of the light-emitting element in the defective pixel is decoupled from the second power line.

4. The display substrate according to claim 3, wherein the plurality of pixels are arranged in arrays, and the normal pixel and the defective pixel are two adjacent pixels disposed in a same column.

5. The display substrate according to claim 1, wherein the first electrode of the light-emitting element is an anode, and the second electrode of the light-emitting element is a cathode.

6. The display substrate according to claim 1, wherein the first electrode of the light-emitting element comprises a first portion and a second portion that are spaced apart.

7. The display substrate according to claim 1, wherein the pixel circuit comprises a data-write sub-circuit, a sense sub-circuit, a regulate sub-circuit, and a drive sub-circuit; wherein
the data-write sub-circuit is coupled to a first gate line, a data line, and a control terminal of the drive sub-circuit, and the data-write sub-circuit is configured to control, in response to a first gate drive signal supplied by the first gate line, conduction or cutoff between the control terminal of the drive sub-circuit and the data line;
the sense sub-circuit is coupled to a second gate line, a sense line, and an output terminal of the drive sub-circuit, and the sense sub-circuit is configured to control, in response to a second gate drive signal supplied by the second gate line, conduction or cutoff between the output terminal of the drive sub-circuit and the sense line;
the regulate sub-circuit is coupled to the control terminal and the output terminal of the drive sub-circuit, and the regulate sub-circuit is configured to regulate potentials of the control terminal and the output terminal of the drive sub-circuit; and
an input terminal of the drive sub-circuit is coupled to a drive power line, the output terminal of the drive sub-circuit is further coupled to the first electrode of the light-emitting element, and the drive sub-circuit is configured to transmit, in response to a drive power signal supplied by the drive power line and a signal of the control terminal, a drive signal to the first electrode of the light-emitting element;
wherein the second power line is the sense line.

8. The display substrate according to claim 7, wherein the data-write sub-circuit comprises a first transistor; the sense sub-circuit comprises a second transistor; the regulate sub-circuit comprises a storage capacitor; and the drive sub-circuit comprises a third transistor; wherein
a gate electrode of the first transistor is coupled to the first gate line, a first electrode of the first transistor is coupled to the data line, and a second electrode of the first transistor is coupled to a gate electrode of the third transistor;
a gate electrode of the second transistor is coupled to the second gate line, a first electrode of the second transistor is coupled to the sense line, and a second electrode of the second transistor is coupled to a second electrode of the third transistor;
one terminal of the storage capacitor is coupled to a gate electrode of the third transistor, and the other terminal of the storage capacitor is coupled to the second electrode of the third transistor; and
a first electrode of the third transistor is coupled to the drive power line, and the second electrode of the third transistor is further coupled to the first electrode of the light-emitting element.

9. The display substrate according to claim 1, wherein the second power line and the repair line are disposed in different layers, and the display substrate further comprises:
an insulator layer disposed between the second power line and the repair line, and a via running through the insulator layer, wherein the second power line is lapped to the repair line by the via.

10. The display substrate according to claim 9, wherein the pixel circuit further comprises an active layer, a gate insulator layer, a gate metal layer, an inter-layer dielectric layer, and a source-drain metal layer that are successively stacked along a direction away from the substrate; and
the display substrate further comprises a light shield layer disposed between the substrate and the active layer;
wherein the second power line and the source-drain metal layer are disposed in a same layer, and the repair line and the light shield layer are disposed in a same layer.

11. A method for repairing a display substrate, applicable to repairing the display substrate as defined in claim 1, the method comprising:
in the case that a defective pixel is present in a plurality of pixels, and the defective pixel is a dark pixel, coupling a second power line to a first electrode of a light-emitting element in the defective pixel by a repair line; and
supplying a second power signal to the first electrode of the light-emitting element in the defective pixel by the second power line;
wherein a potential of the second power signal is greater than a potential of a first power signal supplied by a first power line coupled to a second electrode of the light-emitting element.

12. The method according to claim 11, further comprising:
in the case that a fused foreign matter is exhibited in the defective pixel, decoupling the second power line from the first electrode of the light-emitting element in the defective pixel; and
in the case that the fused foreign matter is not exhibited in the defective pixel or the defective pixel is a bright pixel, decoupling the first electrode of the light-emitting element in the defective pixel from a pixel circuit in the defective pixel, decoupling the first electrode of the light-emitting element in the defective pixel from the second power line, and coupling the first electrode of the light-emitting element in the defective pixel to a first electrode of a light-emitting element in a normal pixel by the repair line, wherein the normal pixel and the defective pixel share a same one of the repair lines and are of a same color.

13. The method according to claim 12, wherein coupling the second power line to the first electrode of the light-emitting element in the defective pixel by the repair line comprises:
welding, by a laser welding process, the repair line to the first electrode of the light-emitting element in the defective pixel to couple the second power line to the first electrode of the light-emitting element in the defective pixel by the repair line;
coupling the first electrode of the light-emitting element in the defective pixel to the first electrode of the light-emitting element in the normal pixel by the repair line comprises:
welding, by the laser welding process, the repair line to the first electrode of the light-emitting element in the defective pixel and the first electrode of the light-emitting element in the normal pixel to couple the first electrode of the light-emitting element in the defective pixel to the first electrode of the light-emitting element in the normal pixel;
decoupling the first electrode of the light-emitting element in the defective pixel from the second power line comprises:
coupling, by a laser cutting process, the repair line to the first electrode of the light-emitting element in the defective pixel to decouple the second power line from the first electrode of the light-emitting element in the defective pixel; and decoupling the first electrode of the light-emitting element in the defective pixel from the pixel circuit in the defective pixel comprises:

decoupling, by the laser cutting process, the first electrode of the light-emitting element in the defective pixel from the pixel circuit in the defective pixel.

14. A method for preparing a display substrate, applicable to preparing the display substrate as defined in claim 1, the method comprising:

providing a substrate;

forming a plurality of pixels on a side of the substrate, wherein each of the pixels comprises a pixel circuit and a light-emitting element, wherein the pixel circuit is coupled to a first electrode of the light-emitting element, a second electrode of the light-emitting element is coupled to a first power line, the pixel circuit is configured to transmit a drive signal to the first electrode of the light-emitting element, and the light-emitting element is configured to emit light based on the drive signal and a first power signal supplied by the first power line; and forming at least one second power line and a plurality of repair lines on a side of the substrate and coupling the second power line to the repair line, wherein an orthographic projection of the repair line on the substrate is overlapped with an orthographic projection of the first electrode of the light-emitting element on the substrate, the repair line is configured to couple the second power line to a first electrode of a light-emitting element in a defective pixel in the plurality of pixels, and the second power line is configured to transmit a second power signal to the first electrode of the coupled light-emitting element by the repair line;

wherein the defective pixel comprises a dark pixel, and a potential of the second power signal is greater than a potential of the first power signal.

15. A display device, comprising: a power supply component and a display substrate; wherein the display substrate comprises:

a substrate;

a plurality of pixels, disposed on a side of the substrate, each of the pixels comprising a pixel circuit and a light-emitting element, wherein the pixel circuit is coupled to a first electrode of the light-emitting element, a second electrode of the light-emitting element is coupled to a first power line, the pixel circuit is configured to transmit a drive signal to the first electrode of the light-emitting element, and the light-emitting element is configured to emit light based on the drive signal and a first power signal supplied by the first power line; and at least one second power line and a plurality of repair lines that are disposed on a side of the substrate, wherein the second power line is coupled to the repair line, an orthographic projection of the repair line on the substrate being overlapped with an orthographic projection of the first electrode of the light-emitting element on the substrate, the repair line is configured to couple the second power line to a first electrode of a light-emitting element in a defective pixel in the plurality of pixels, and the second power line is configured to transmit a second power signal to the first electrode of the coupled light-emitting element by the repair line;

wherein the defective pixel comprises a dark pixel, and a potential of the second power signal is greater than a potential of the first power signal; and the power supply component is coupled to the display substrate and is configured to supply power to the display substrate.

16. The display device according to claim 15, wherein the potential of the first power signal is 0 V, and the potential of the second power signal is greater than 6 V and less than or equal to 12 V.

17. The display device according to claim 15, wherein the plurality of pixels are of at least two colors, and at least two pixels of a same color share a same one of the repair lines;

the repair line is further configured to couple the first electrode of the light-emitting element in the defective pixel to a first electrode of a light-emitting element in a normal pixel, the normal pixel and the defective pixel sharing a same one of the repair lines and being of a same color, and the defective pixel comprising a bright pixel; and in response to the repair line coupling the first electrode of the light-emitting element in the defective pixel to the first electrode of the light-emitting element in the normal pixel, the first electrode of the light-emitting element in the defective pixel is decoupled from a pixel circuit in the defective pixel, and the first electrode of the light-emitting element in the defective pixel is decoupled from the second power line.

18. The display device according to claim 17, wherein the plurality of pixels are arranged in arrays, and the normal pixel and the defective pixel are two adjacent pixels disposed in a same column.

19. The display device according to claim 15, wherein the first electrode of the light-emitting element is an anode, and the second electrode of the light-emitting element is a cathode.

20. The display device according to claim 15, wherein the first electrode of the light-emitting element comprises a first portion and a second portion that are spaced apart.

* * * * *